United States Patent [19]
Chen

[11] Patent Number: 5,465,006
[45] Date of Patent: Nov. 7, 1995

[54] BIPOLAR STRIPE TRANSISTOR STRUCTURE

[75] Inventor: Yaw-Hwang Chen, Ft. Collins, Colo.

[73] Assignee: Hewlett-Packard Company, Palo Alto, Calif.

[21] Appl. No.: 276,020

[22] Filed: Jul. 15, 1994

[51] Int. Cl.$^6$ .......................... H01L 29/73; H01L 29/70; H01L 29/40
[52] U.S. Cl. .......................... 257/557; 257/592; 257/586; 257/559
[58] Field of Search .......................... 257/592, 587, 257/588, 557, 559, 501, 519

[56] References Cited

U.S. PATENT DOCUMENTS

| | | | |
|---|---|---|---|
| 4,780,427 | 10/1988 | Sakai et al. | 257/592 |
| 5,008,210 | 4/1991 | Chiang et al. | 437/33 |
| 5,144,403 | 9/1992 | Chiang et al. | 257/592 |

Primary Examiner—Mahshid D. Saadat
Assistant Examiner—Wael M. Fahmy
Attorney, Agent, or Firm—Cynthia S. Baan

[57] ABSTRACT

This invention pertains to a lateral bipolar transistor comprising an emitter, a base and a collector. The transistor exhibits improved function and overall size reduction, due to the base and emitter structure. An island forms both the base and emitter regions in the transistor structure with the base region being above the collector region, below the emitter region, and surrounded by a dielectric region. The emitter is surrounded by emitter isolation walls, which are formed approximately 0.2 microns above the plane of the dielectric region, such that any manufacturing variances will not cause the emitter isolation walls to contact the dielectric region and pinch-off the base region from the base junction region. This structure also allows the size of the base-emitter junction to be decreased without increasing the parasitic characteristics of the transistor.

13 Claims, 24 Drawing Sheets

BIPOLAR STRIPE TRANSISTOR STRUCTURE

FIELD OF THE INVENTION

This invention relates generally to a bipolar transistor structure, comprising an emitter, an intrinsic base underlying the emitter, and a collector underlying the intrinsic base, and more particularly to a method of manufacturing a bipolar transistor that will permit an overall transistor size reduction and improvement in the electrical characteristics of the transistor.

BACKGROUND OF THE INVENTION

In semiconductor circuit devices, finer pattern techniques are being developed and integration densities are increasing. However, with miniaturization, designers must also be concerned with unwanted parasitic components which decrease the operating speed of the devices. Another impediment to miniaturization is the alignment requirements for emitters and emitter isolation walls, which result in increased emitter-base junction size and a correspondingly larger base-collector junction size. These larger than desired junction areas, besides limiting device reduction efforts, can introduce unwanted parasitic capacitance which limits the device or circuit performance.

FIG. 1 shows a conventional lateral bipolar transistor 20. An N-type buried collector region 22 is selectively formed in a P-type semiconductor substrate 21. After field oxide regions 23 and 24 and collector isolation region 27 are formed by any known technique, a P-type base region 25 is formed at the surface of the N-type collector region 22. A polysilicon layer is formed and selectively doped P-type for base contact region 26.

Thereafter, an isolation trench is etched and filled with an oxide or other insulator 31 to form an isolation trench 31 around an emitter region 30. Polysilicon regions 28 and 29 are then doped and diffused down to form N+-type emitter region 30, an N-type emitter contact region 28, and N-type collector contact region 29. Surface insulation layer 32 is formed and patterned to open metalization contact areas for the base, emitter and collector regions, respectively. A silicide layer 33, 34 and 35 may be applied to enhance the electrical characteristics of the contact regions between the polysilicon and device contact metalization.

With regards to the bipolar transistor described in FIG. 1, it should be noted that the distance between field oxide region 24 and collector insulation wall 27 is limited to a critical variance dimension of at least about 1.8 microns, due to current manufacturing variances of approximately 0.3 microns in alignment. Accordingly, in the device of FIG. 1, if the distance between field oxide region 24 and collector isolation wall 27 is less than the critical variance dimension of approximately 1.8 microns, when the emitter isolation walls 31 are etched, the base region 26 can be totally pinched off due to alignment variances. That is, isolation wall 31 can come into contact with field oxide region 24, thus pinching-off the base contact area 26.

This alignment problem can be minimized by using a circular base contact region. However, such a solution would increase the overall size of the device as well. Due to this critical variance dimension of approximately 1.8 microns of the base region 25, there will be larger than desirable base-collector junction capacitance, extrinsic base resistance, and overall transistor size.

SUMMARY OF THE INVENTION

It is an object of the present invention to provide an improved lateral bipolar transistor structure which has reduced unwanted parasitic base resistance and capacitance in order to achieve a higher speed of operation.

It is another object of the present invention to provide a method of making such an improved lateral bipolar transistor structure.

It is a further object of the present invention to provide an improved lateral bipolar transistor structure and method of manufacture that allows overall reduction in the size of the transistor device and uniformity of results.

The above and other objects of the present invention are accomplished by providing a mesa shaped base region of a second conductivity with a mesa shaped emitter region of a first conductivity formed thereon. A field oxide is formed around the mesa shaped base region. A planarized polysilicon layer is then formed on the field oxide layer and over the top of the mesa shaped base island region. The polysilicon layer and the mesa shaped base region are then etched to form emitter isolation walls, which are filled with oxide or other insulation material. The emitter isolation walls do not extend down to the top surface of the field oxide. An emitter region of a first conductivity is formed on the base region inside the emitter isolation wall. This structure prevents any manufacturing variances from pinching-off the base region with the emitter isolation walls.

The present invention also permits reduction in the transistor device dimensions, reduction in the extrinsic base resistance, reduction of the base-collector junction capacitance, and enhancement in the device operation speed. These and other objects and advantages of the present invention will become apparent from the drawings and detailed description provided hereinafter.

BRIEF DESCRIPTION OF THE DRAWINGS

The above and other objects, features, and advantages of the present invention will be better understood by reading the following more particular description of the invention, presented in conjunction with the following drawings, wherein.

DETAILED DESCRIPTION OF THE PRESENT INVENTION

Figure 2:
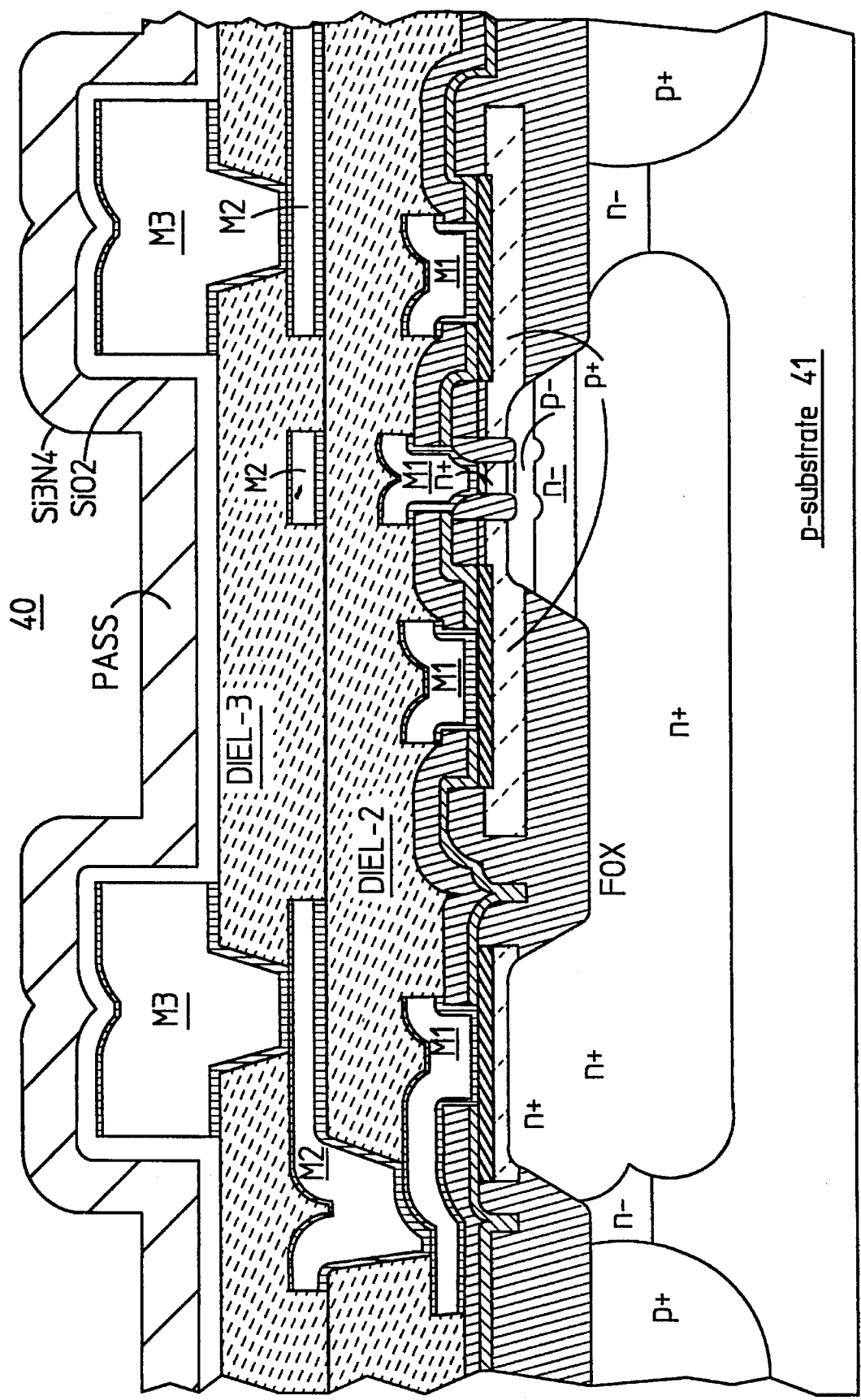
FIG. 2 shows a cross-sectional view of a lateral bipolar transistor device according to the present invention.
Figure 3A:
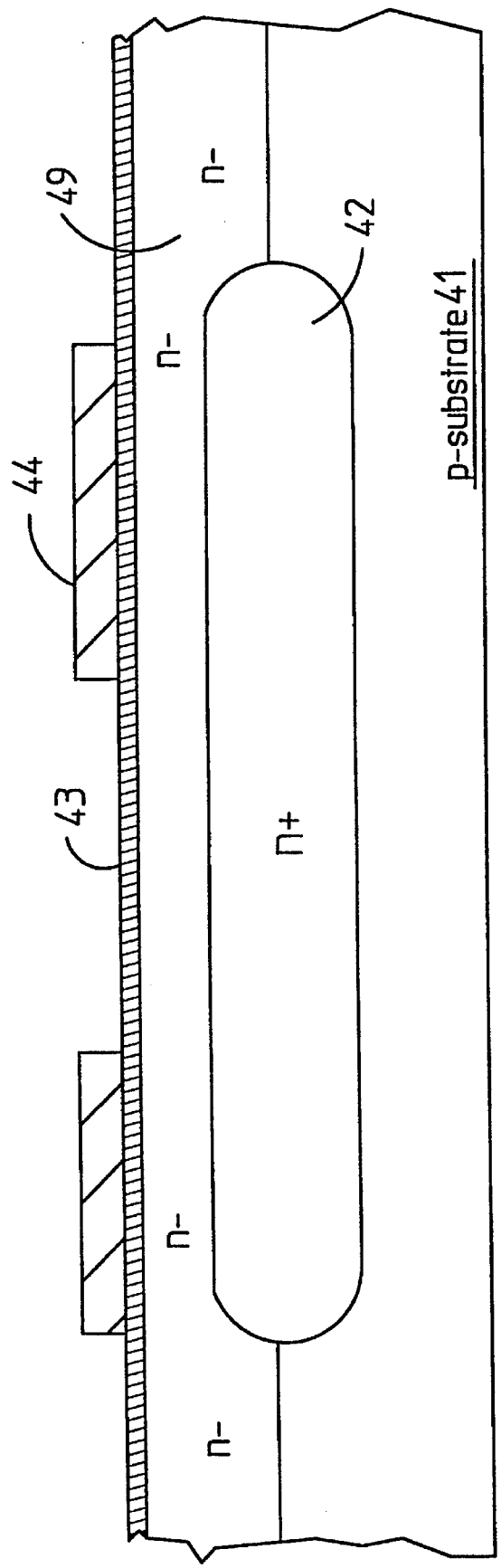
FIG. 3A–U are; schematics showing cross-sectional views of a bipolar transistor as it progresses through process steps leading up to formation of the bipolar transistor device of the present invention.

FIG. 2 shows a lateral bipolar transistor 40 according to the present invention. The fabrication of bipolar transistor 40 is accomplished through a series of steps illustrated in FIGS. 3A–U. Bipolar transistor 40 is fabricated on a P-type <100> substrate, as shown in FIG. 3A. Oxide (not shown) is grown on the surface of the substrate and patterned to form a buried layer mask by any conventional method. A thin screen oxide layer (not shown) is grown on the surface of the substrate and followed by a heavy application of arsenic, or other N-type dopant such as antimony is then implanted into the substrate 41 through the unmasked areas. The N+-type buried layer 42 is then thermally driven-in to the substrate 41 to define sub-collector 42. The oxide mask is then removed by any known technique, such as a hydrofluoric acid dip. An N-type epitaxial layer 49 is grown.

Figure 3B:
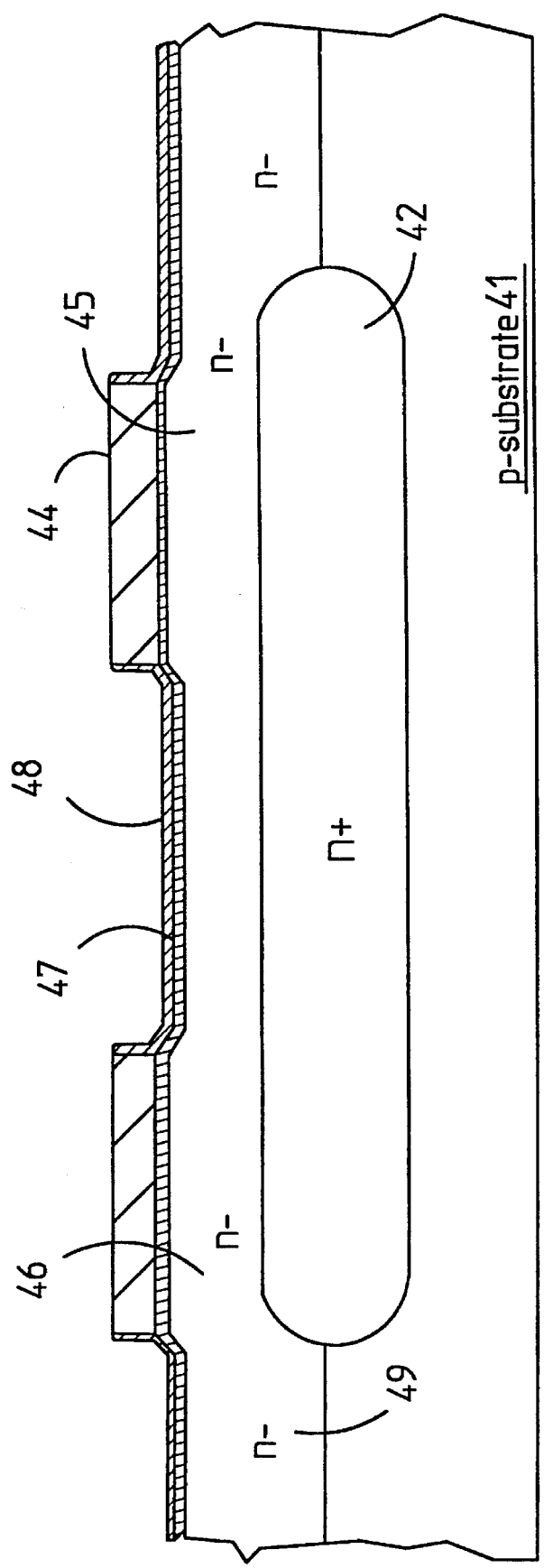

A stress relief oxide (SRO) layer 43 is then thermally grown on the surface of epitaxial layer 49. A nitride ($Si_3N_4$) layer is then deposited, patterned and etched to form nitride mask 44. The SRO is removed from the field areas by a hydrofluoric acid dip or other known method. This step is followed by a silicon recess etch to form islands 45 and 46 as shown in FIG. 3B.

Figure 3C:
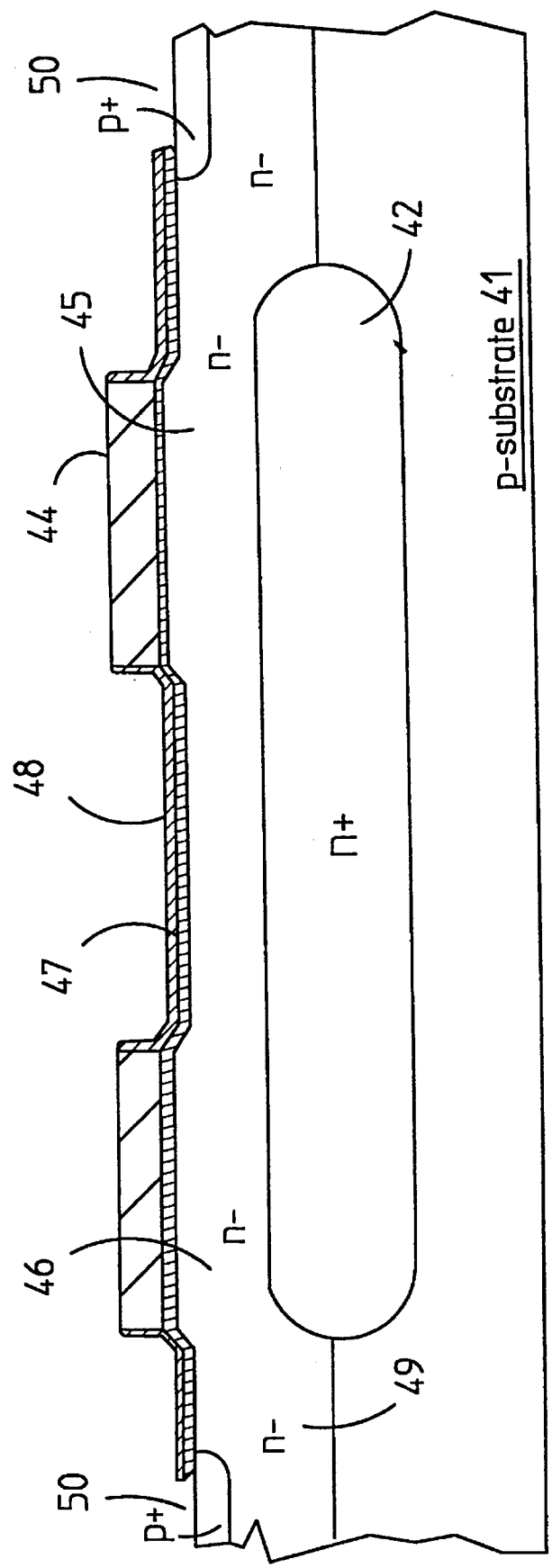
Figure 3D:
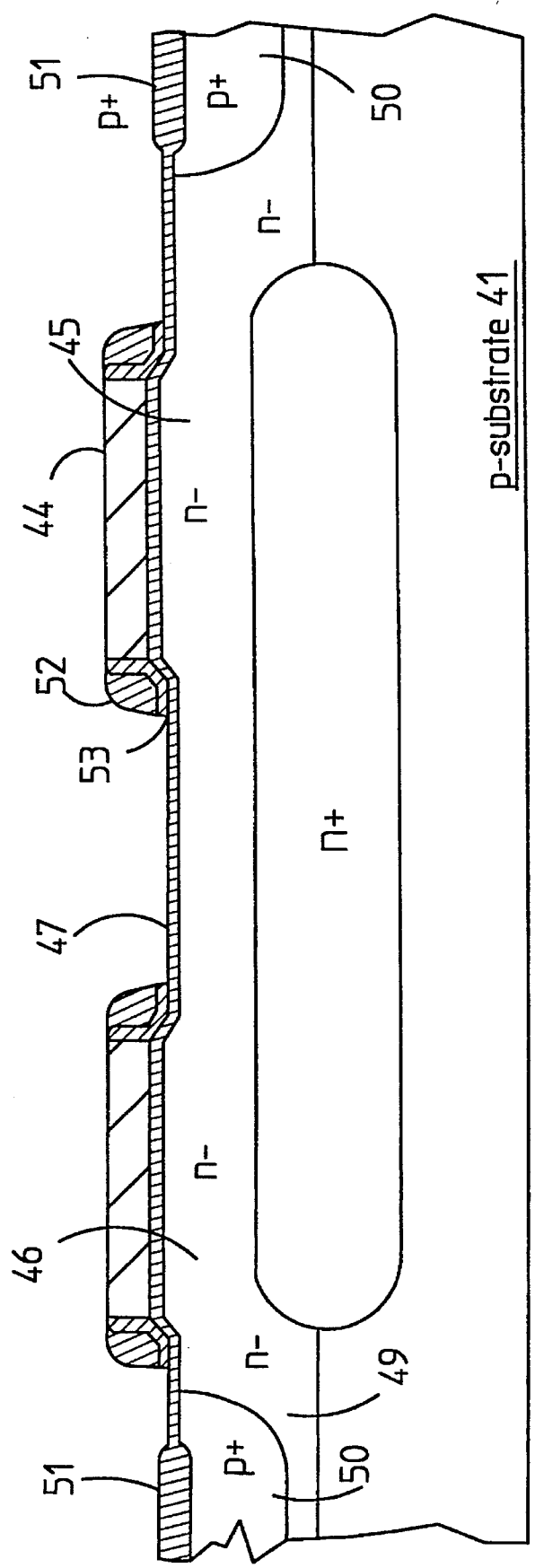

A second stress relief oxide layer 47 is then grown, followed by a thin nitride deposition layer 48. The thin oxide and nitride layers (47 and 48) are then patterned by any known means (for example, nitride etch followed by hydrofluoric acid dip) to form a channel stop mask, as shown in FIG. 3C. Boron is then deposited at channel stop regions 50, which is followed by a channel stop anneal and oxidation at 51, as shown in FIG. 3D.

Figure 3E:
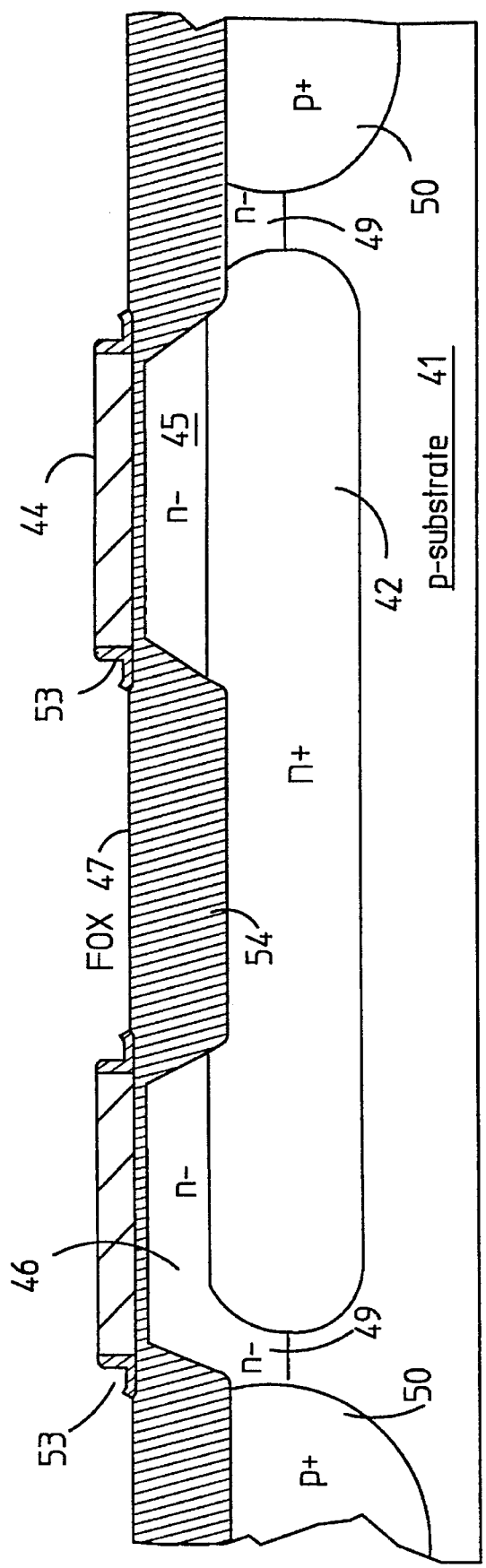
Figure 3F:
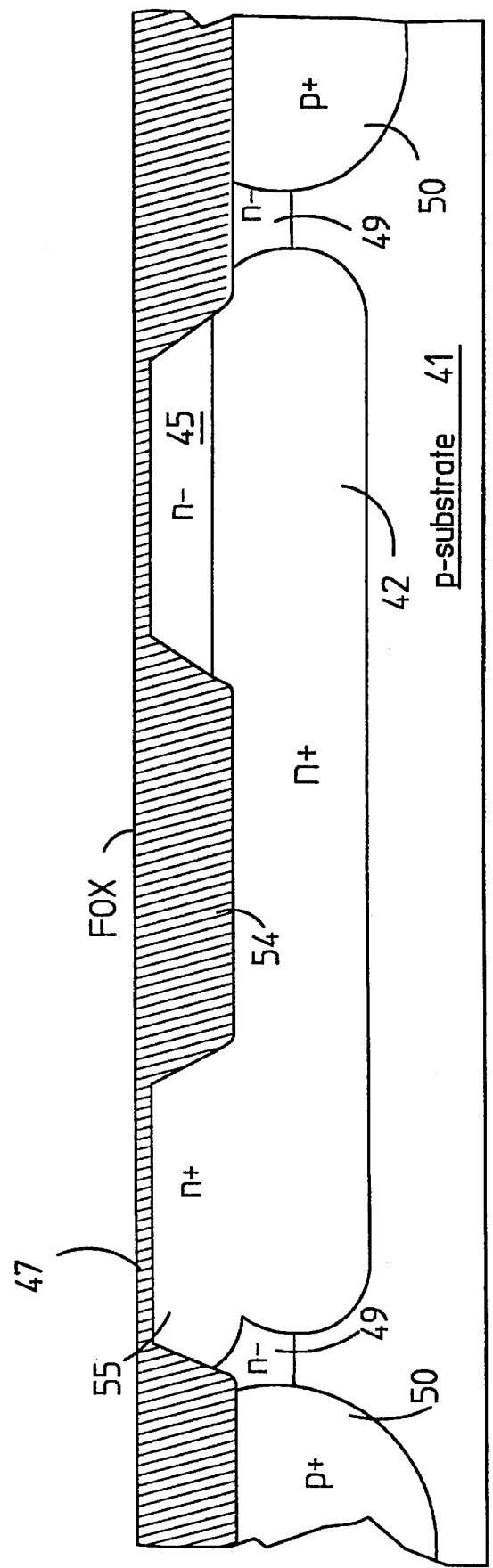

Next, oxide is deposited and etched to form spacer oxide 52. Note, this step also removes the thin nitride layer 48, except for a small layer 53 under spacer oxide 52. The spacer oxide 52 is then removed by a hydrofluoric acid dip, leaving nitride "flaps" 53, as shown in FIG. 3E. This is followed by field oxidation of 54. The nitride island 44 is then stripped as shown in FIG. 3F.

Figure 3G:
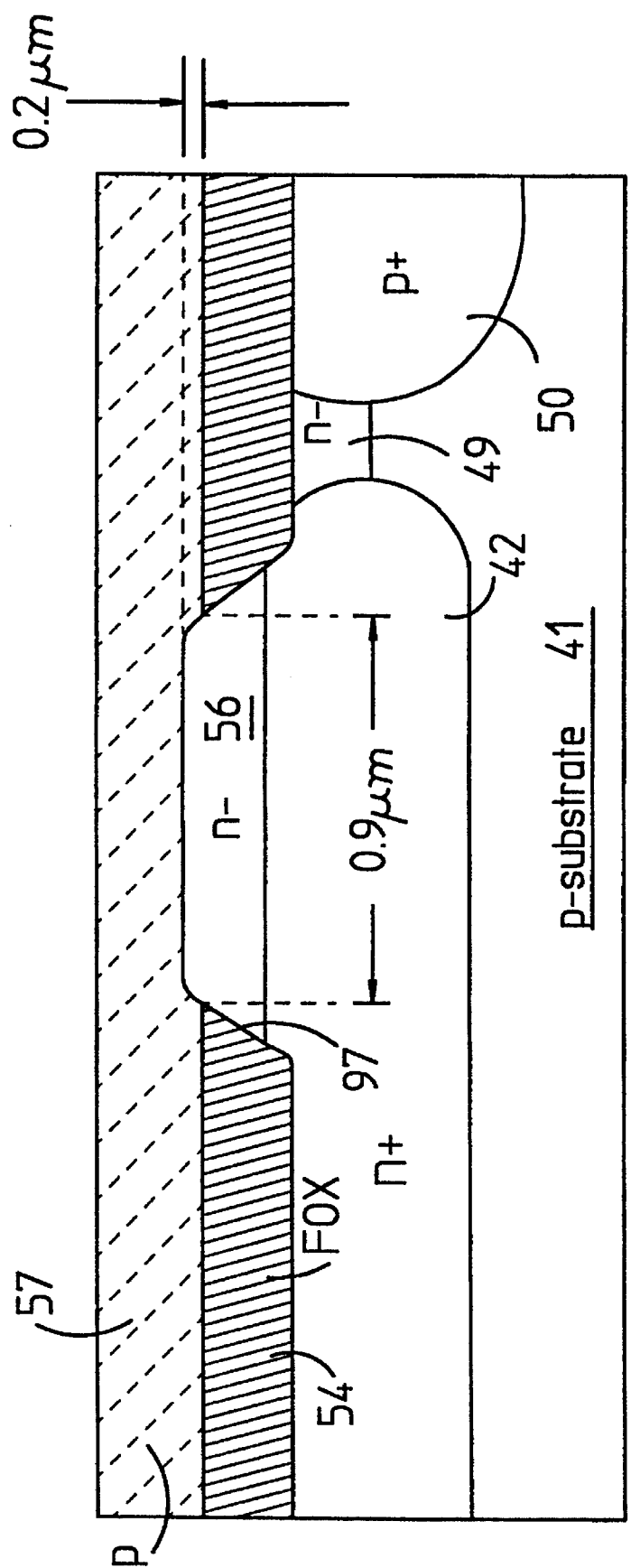

Subsequently, a collector implant mask (not shown) is formed and phosphorus is implanted into the collector region at 55. The collector implant mask is then stripped and the collector is thermally driven-in at 55. Stress relief oxide 47 is then stripped. This stripping process is continued long enough that approximately 0.2 microns of field oxide region 54 is also removed, which leaves island 56 extending approximately 0.2 microns above field oxide region 54, as shown in FIG. 3G. Island 56 is approximately 0.9 microns in diameter at the top edge of field oxide region 54. The side wall 99 of island 56 is approximately at a 45–65 degree angle from the top surface of mesa 56, with approximately 55 degrees being optimal.

Figure 3H:
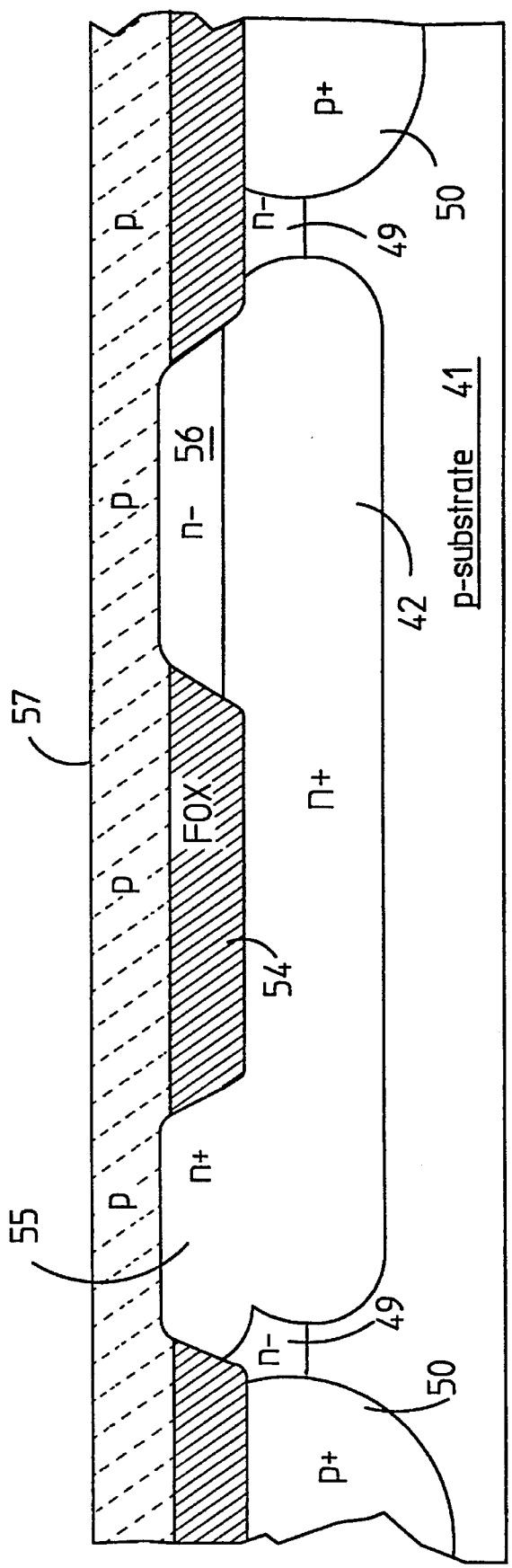
Figure 3I:
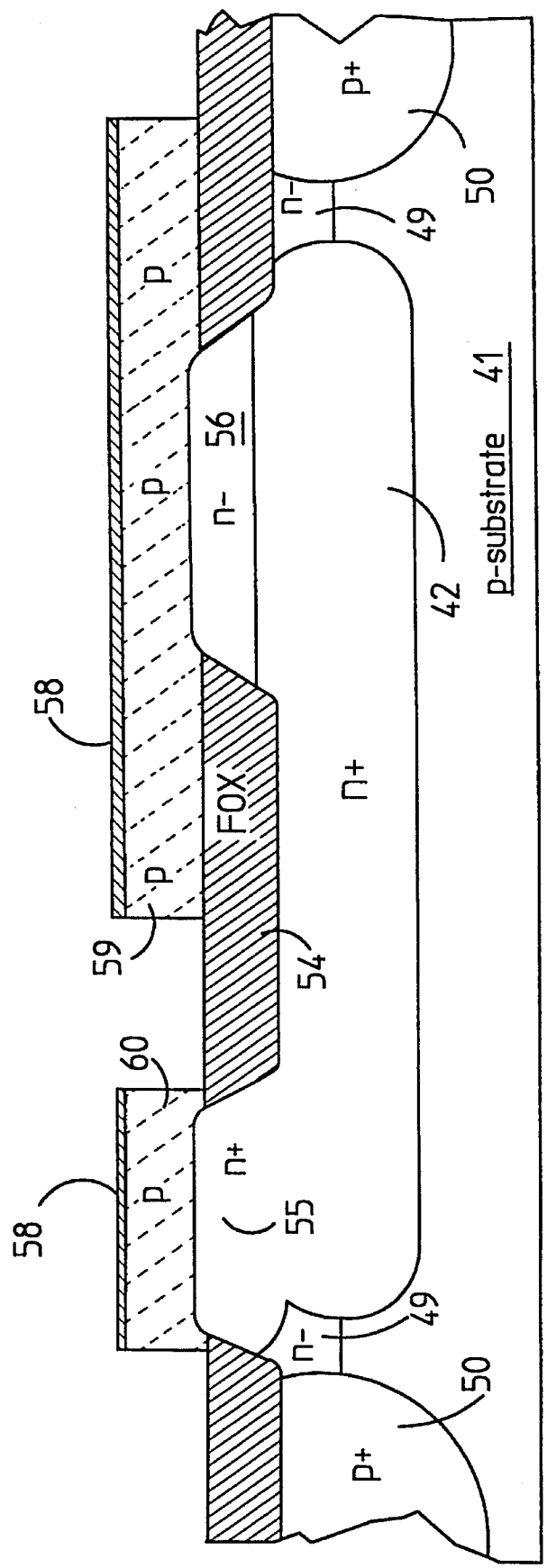
Figure 3J:
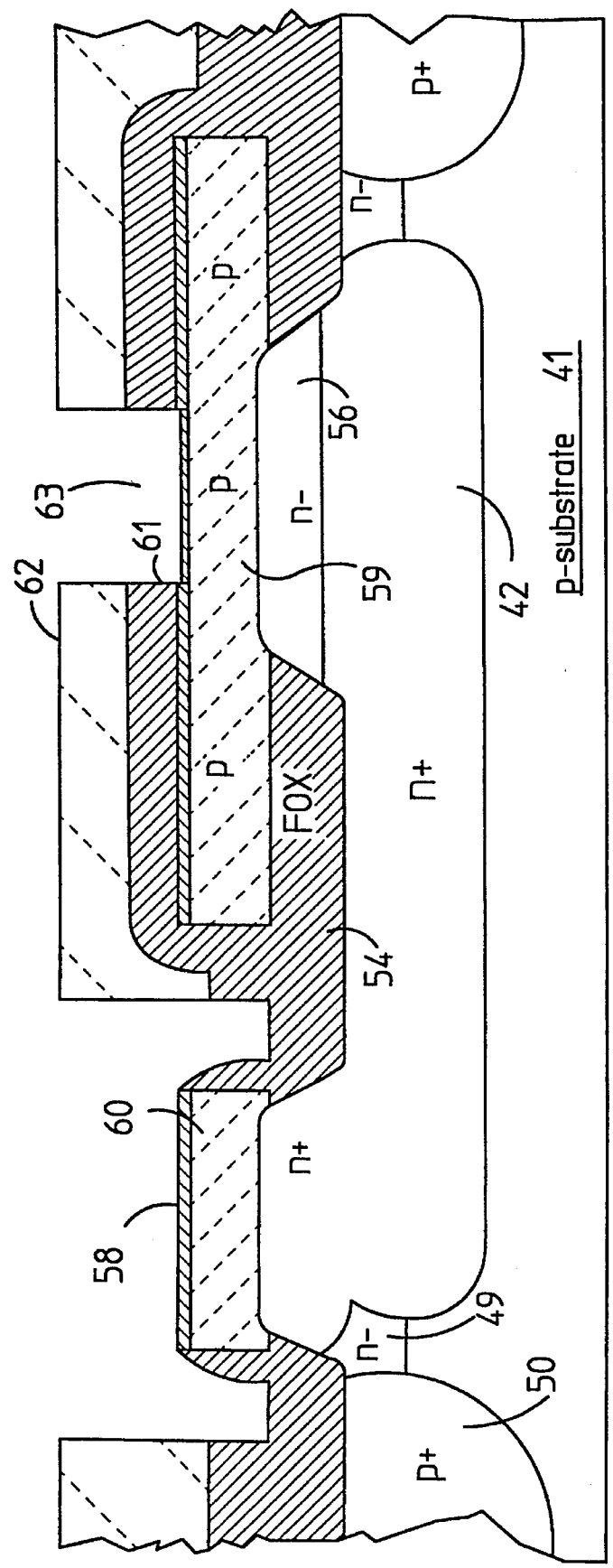
Figure 3K:
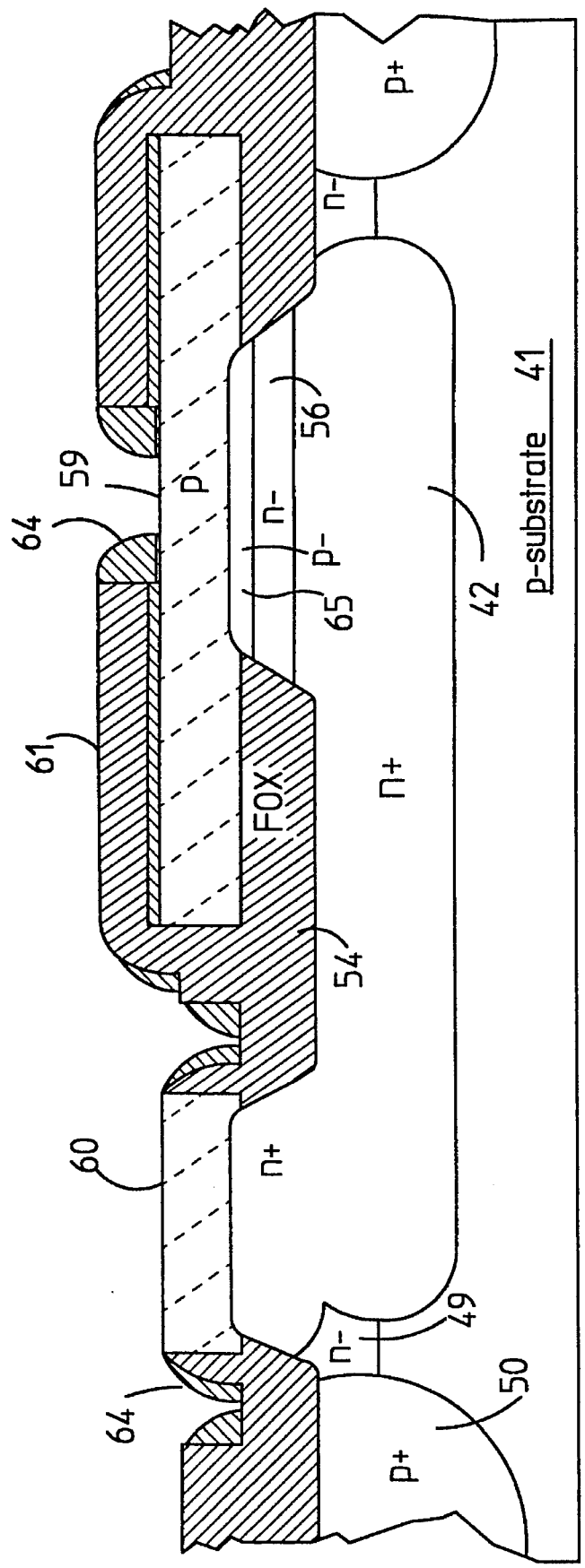

Polysilicon layer 57 is then deposited and implanted with $BF_2$ as shown in FIGS. 3G and 3H. The poly layer can be planarized using the chemical mechanic polishing (CMP) method. A thin nitride layer 58 is then deposited and masked. Next, the nitride and polysilicon layers are etched to form polysilicon regions 59 and 60 (as shown in FIG. 3I) and the resist is stripped. As shown in FIG. 3J, silicon dioxide layer 61 is then deposited followed by "stripe" emitter window mask 62. Then an R.I.E. etch is performed to remove the silicon dioxide 61 from emitter window 63. Resist 62 is then stripped. Next, nitride spacers 64 are deposited, base 65 is thermally driven-in approximately 0.1–0.2 microns, and nitride spacers are etched back, as shown in FIG. 3K.

Figure 3L:
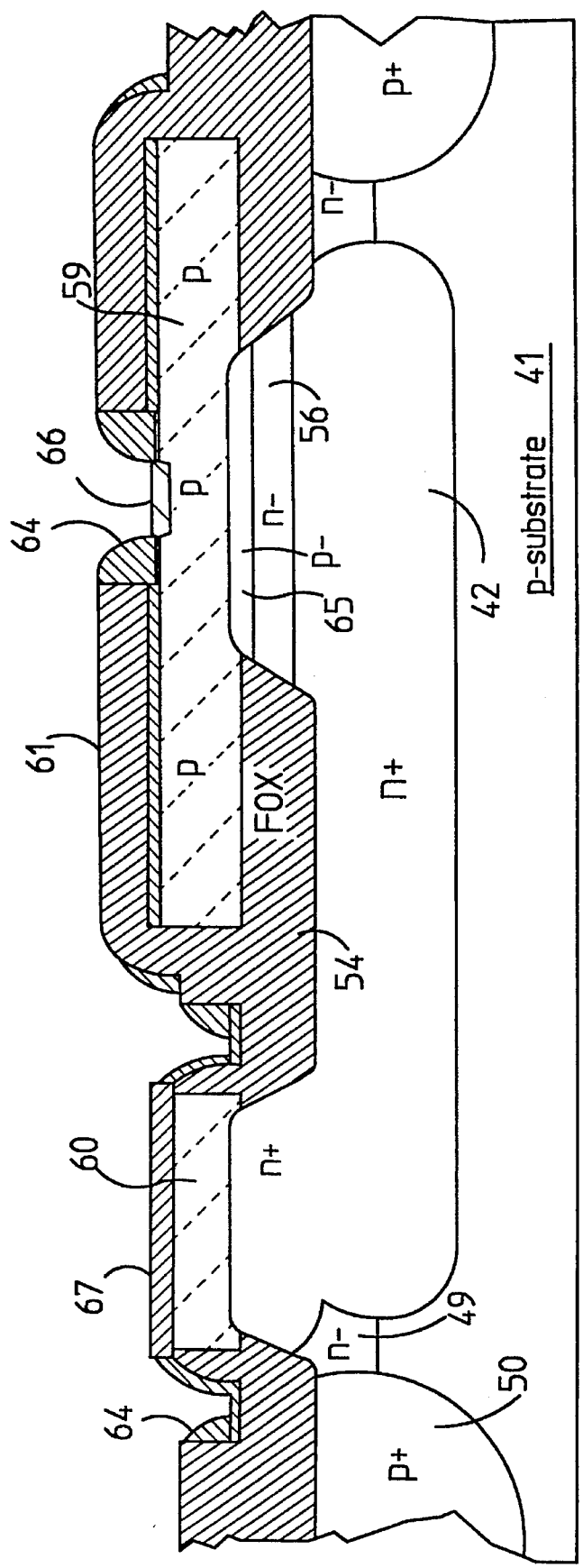
Figure 3M:
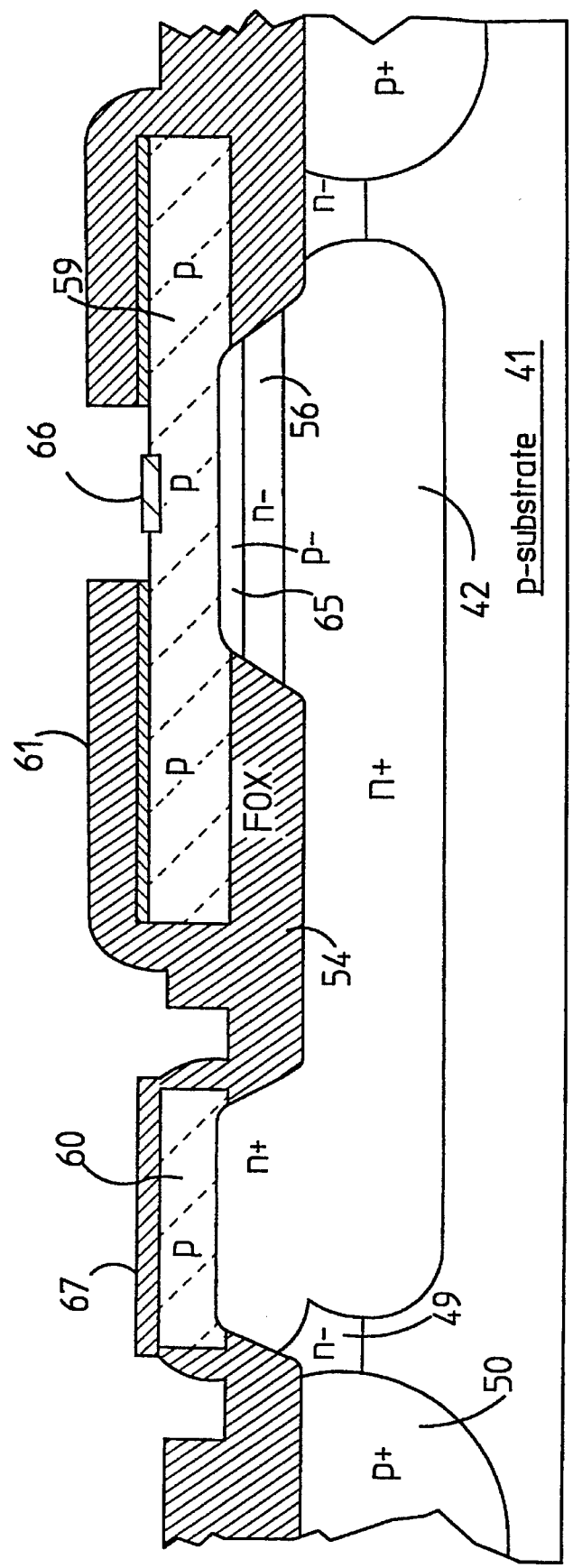
Figure 3N:
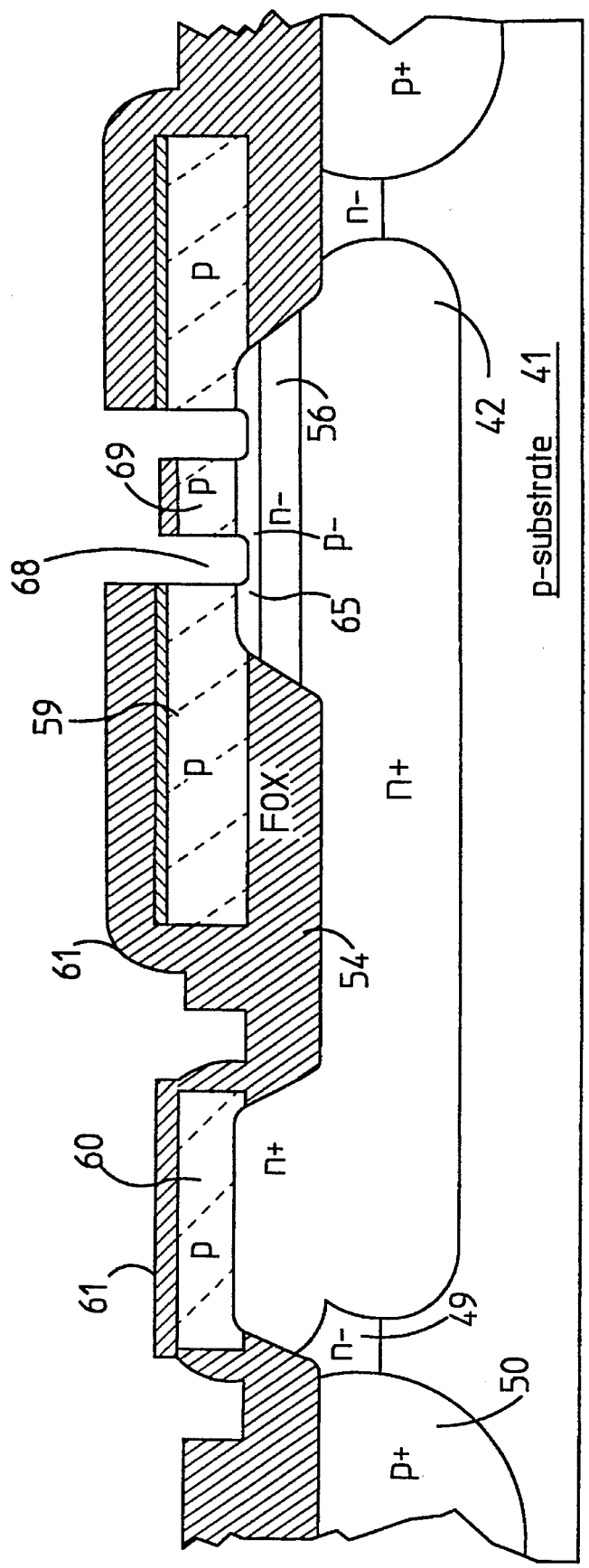
Figure 30:
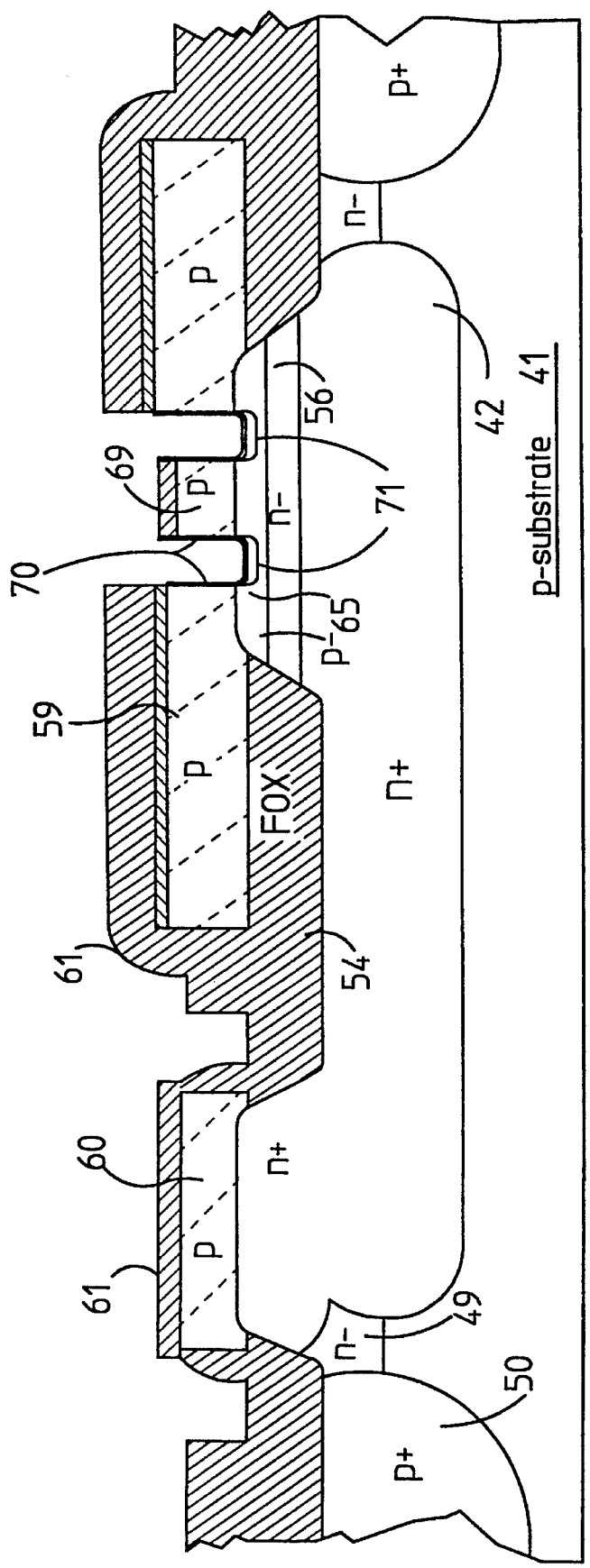

As shown in FIG. 3L, the emitter polysilicon and the collector polysilicon are oxidized at 66 and 67, respectively. The nitride spacers 64 are then stripped, as shown in FIG. 3M. A polysilicon "stripe" etch is then performed to create emitter isolation groove 68, which isolates emitter region 69, as shown in FIG. 3N. This trench 68 is etched through polysilicon layer 59 and approximately 0.1 microns into P⁻-type base region 65. Accordingly, trench 68 stops approximately 0.1 microns above the top surface of field oxide region 54. Thus, allowing for manufacturing misalignment without pinching-off base region 65.

Figure 3P:
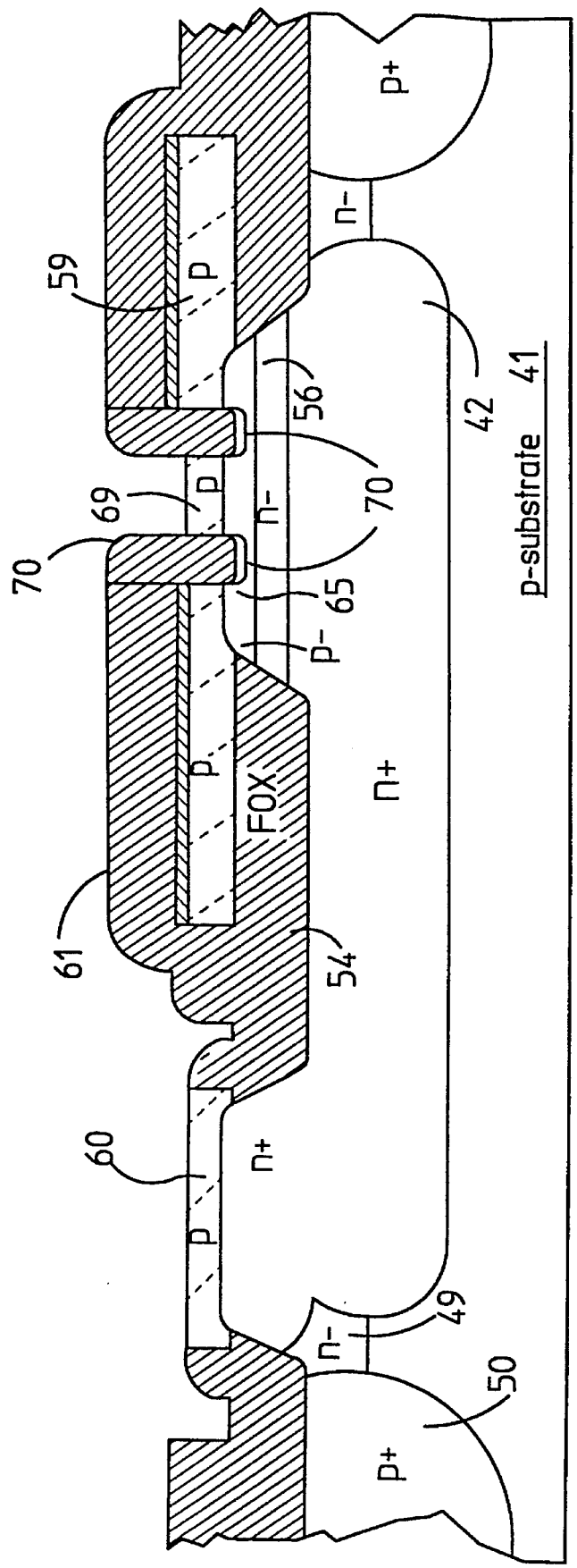

Next, "link" oxidation 70 is formed on the walls of emitter isolation groove 68 and implanted with $BF_2$ to form P-type base link region 71, as shown in FIG. 3O. Oxide 72 is then deposited in emitter isolation groove 68, as shown in FIG. 3P. A blanket etchback of oxide is then performed, exposing collector polysilicon layer 60 and emitter polysilicon layer 69.

Figure 3Q:
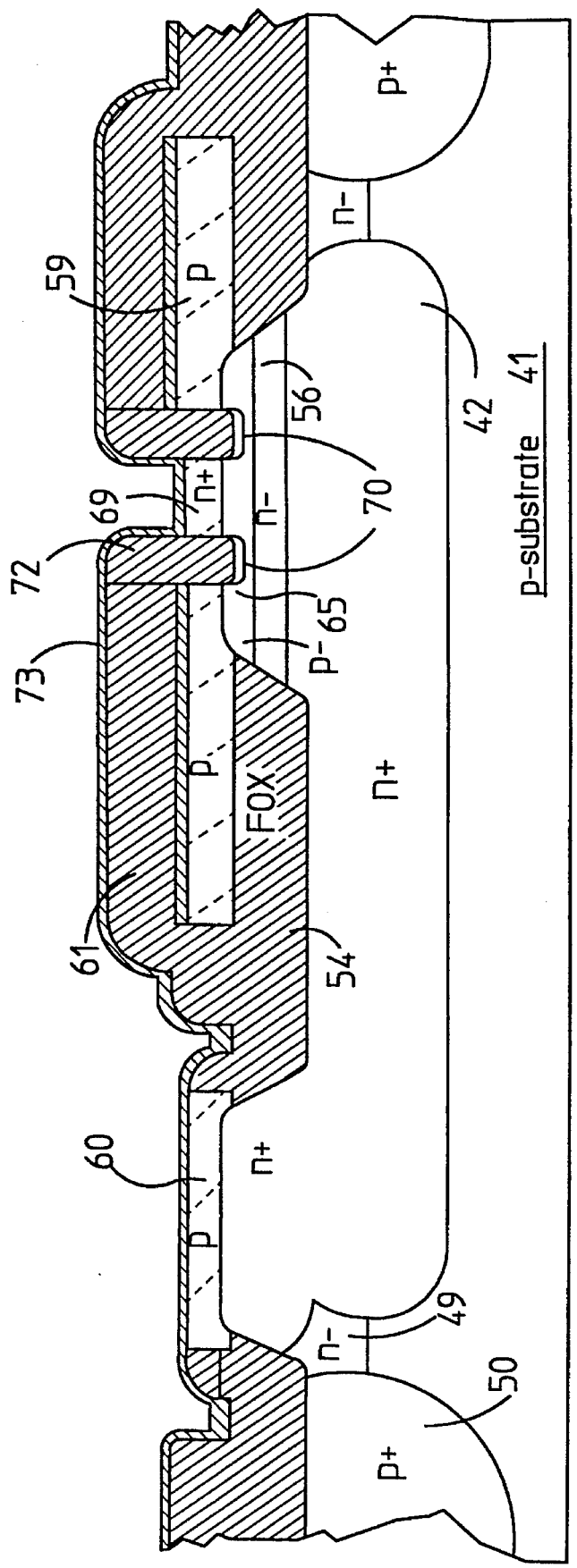
Figure 3R:
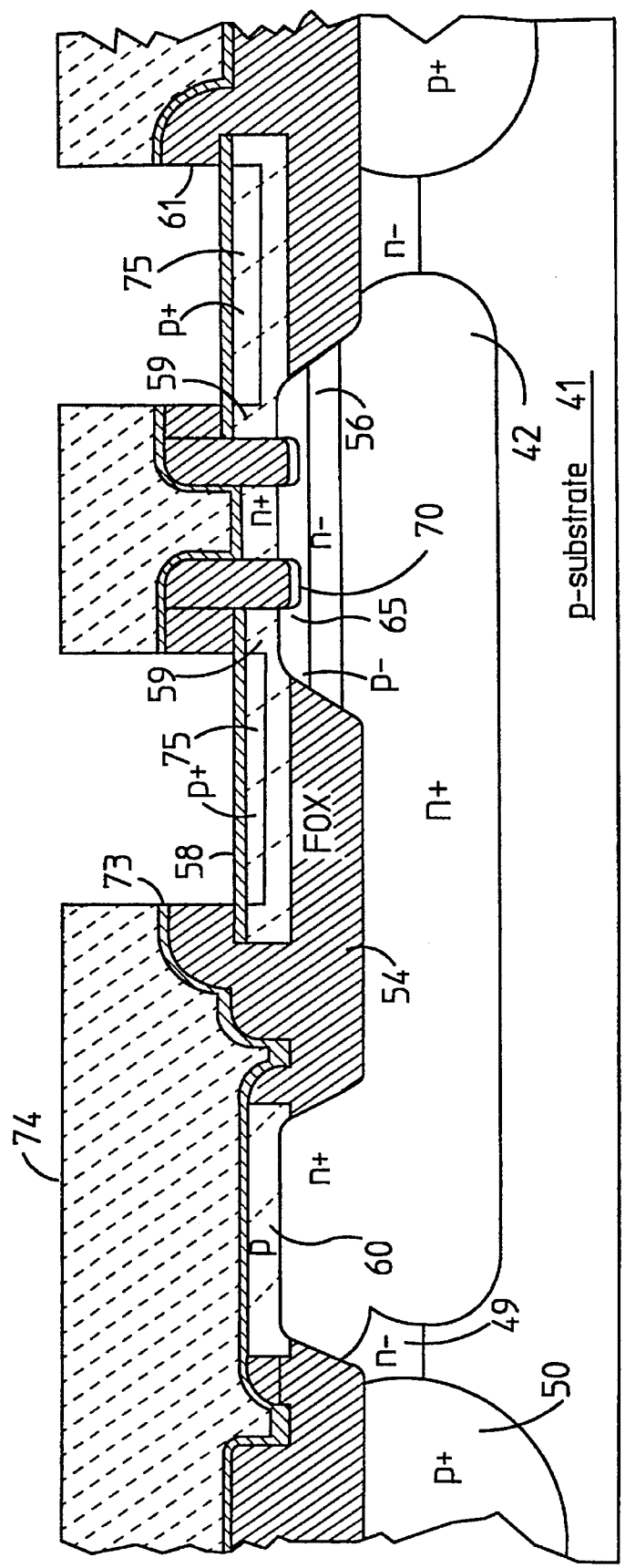
Figure 3S:
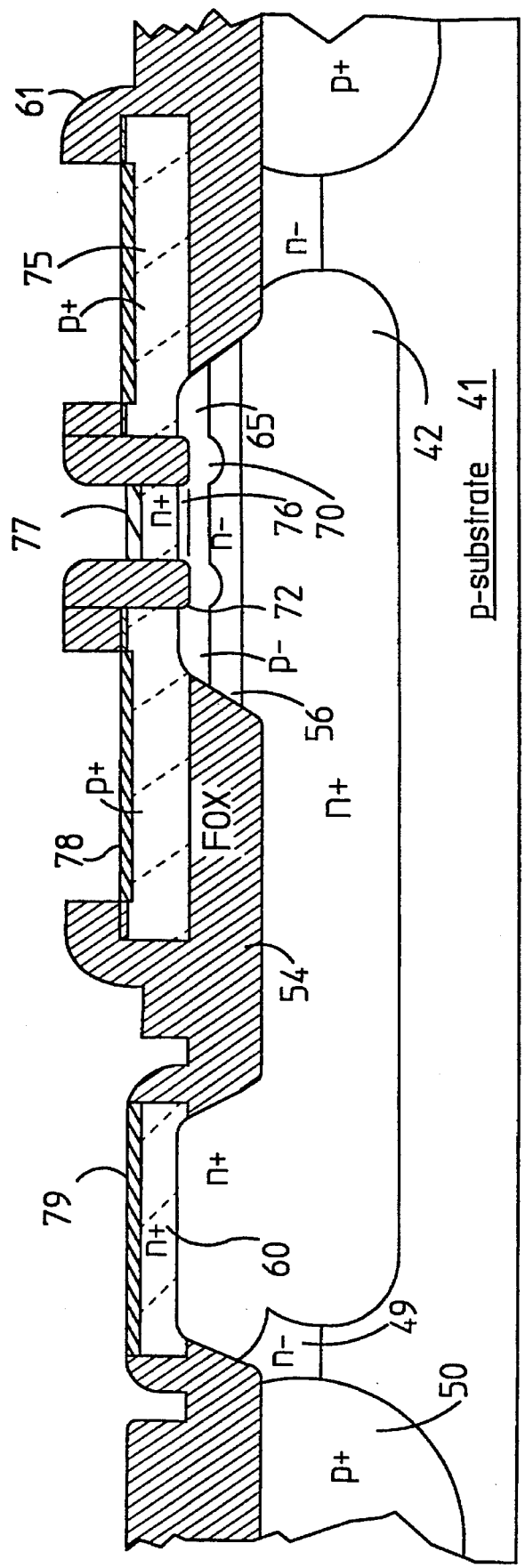

A thin nitride layer 73 is then deposited, as shown in FIG. 3Q, followed by a blanket emitter implant of arsenic. Note that underlying oxide layer 61 serves as a mask during the arsenic implant, so that only the emitter polysilicon region 69 and the collector polysilicon region 60 are doped N⁺-type. A mask 74 is then deposited and patterned with a nitride/oxide etch such that nitride layer 58 above the base polysilicon 59 is exposed. Base polysilicon 59 is then implanted with boron to form P⁺-type region 75, as shown in FIG. 3R. Resist 74 is then stripped. The emitter is thermally driven-in to create N⁺-type emitter subregion 76. Note that P-type link region 70 and P⁺-type base polysilicon region are also driven-in during this process, as shown in FIG. 3S.

Figure 3T:
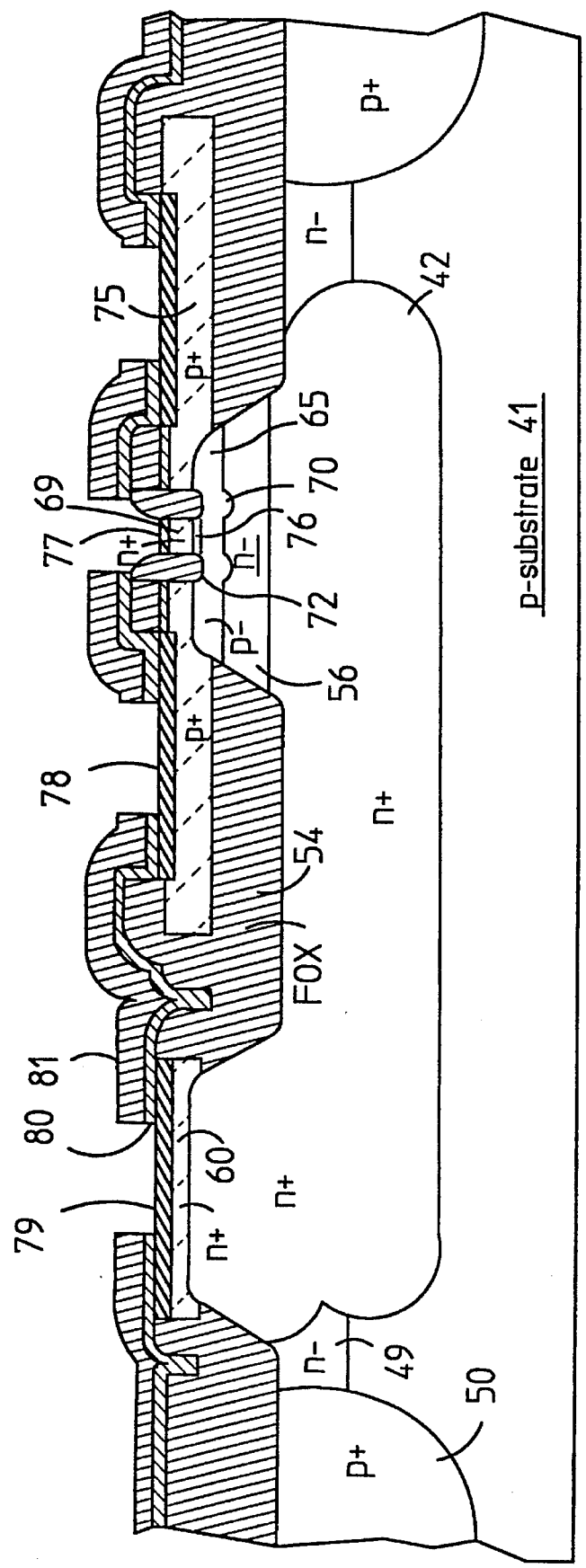
Figure 3U:
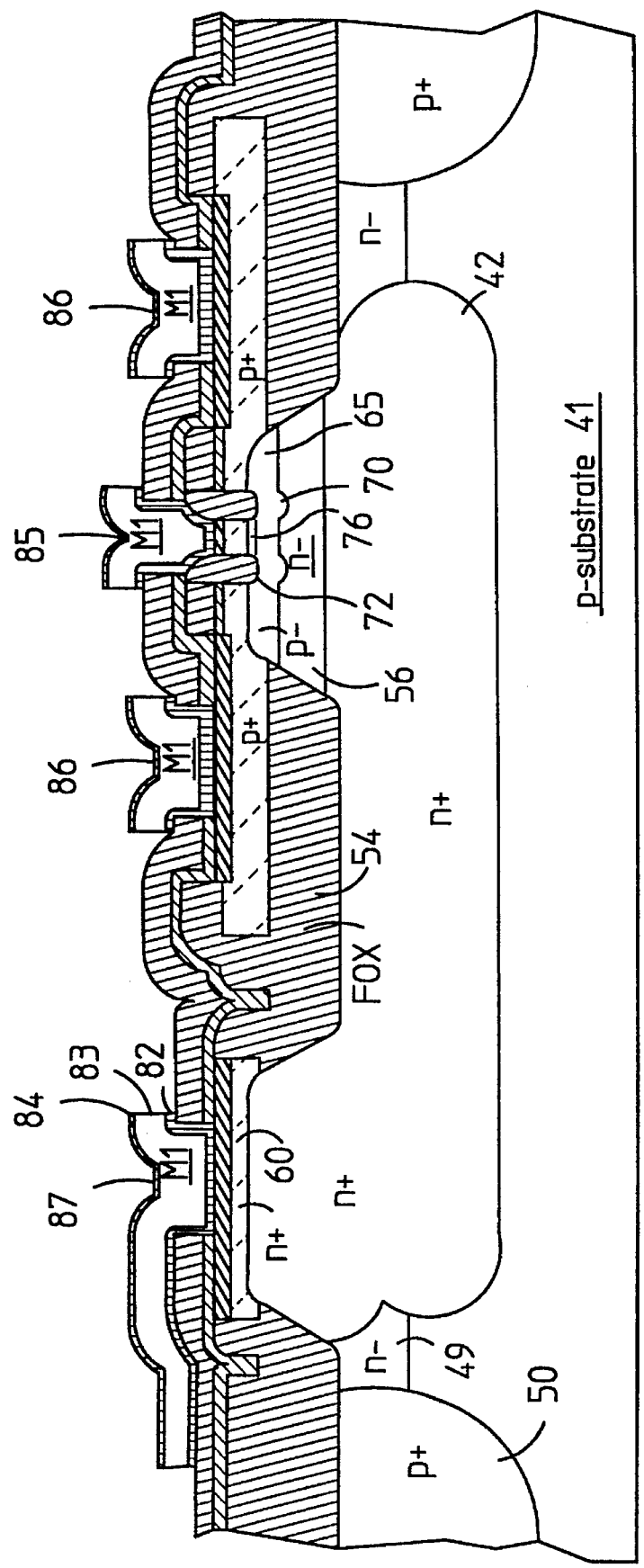

Exposed nitride layers 58 and 73 are then removed by any known method. Platinum is then sputtered on the exposed polysilicon surface, furnace annealed to form platinum silicide (PtSi), and the unreacted platinum is removed via wet etch, as shown in FIG. 3S. A plasma silicon nitride ($Si_3N_4$) deposition 80 is then performed, followed by a PSG deposition 81. Contact areas are masked and etched to form contact regions 77, 78 and 79 as shown in FIG. 3T. Metalization is then deposited, masked and etched to form first level metalization emitter 85, base 86 and collector 87. The metalization can be formed of any known metalization, such as TiW (82), Al—Cu (83) and TiW (84). Other levels of metalization and passivation may be formed as required, shown in FIG. 2.

Figure 4:
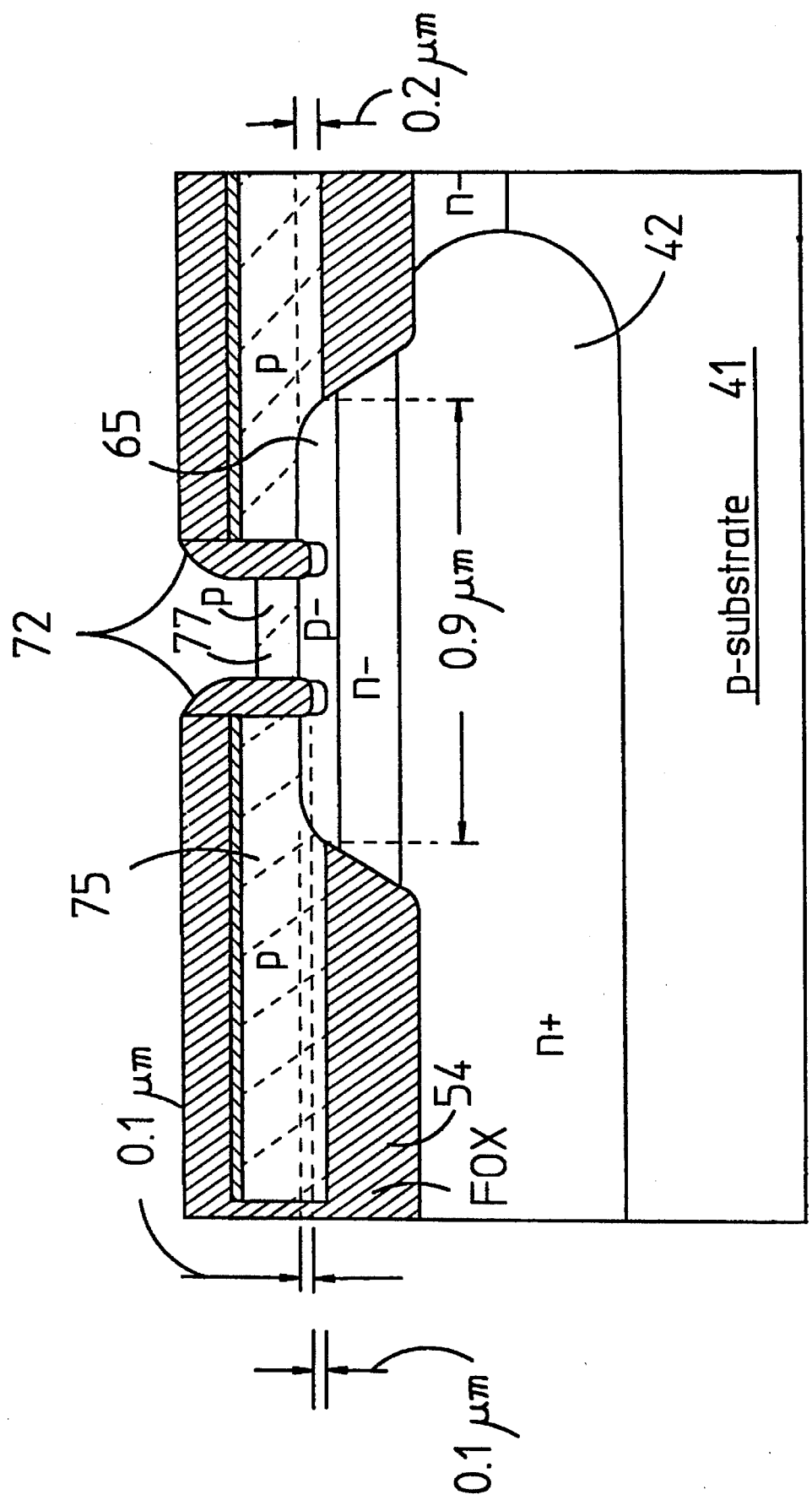
FIG. 4 shows an enlarged cross-sectional view of a bipolar transistor emphasizing the base-emitter island region structure according to the present invention.

The base island mesa region of the present invention enables the transistor to be substantially smaller in size than conventional transistors without any degradation in device performance. Specifically, as shown in FIG. 4, the mesa island region extends approximately 0.2 microns above the top surface of field oxide region 54, and emitter isolation wall 72 extends into the base region 65 below the emitter region 77 approximately 0.1 microns. Accordingly, the base region 65 at the surface of the field oxide region 54 is approximately 0.9 micron in diameter. Even with a manufacturing alignment tolerance of 0.3 microns, the emitter isolation oxide region 72 is not able to come into contact with field oxide regions 54 and pinch off the base regions 65 and 75.

Figure 1:
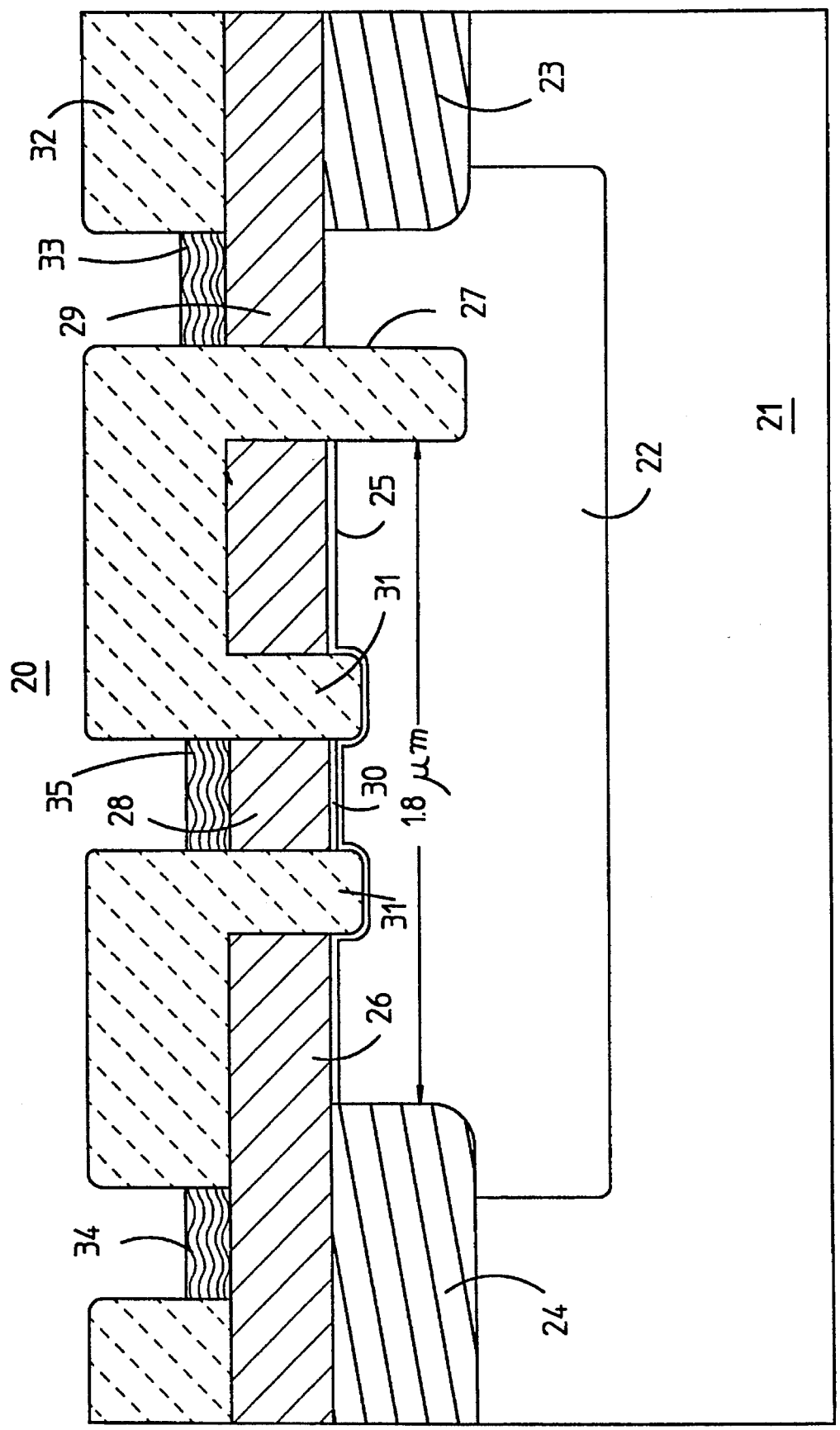
FIG. 1 shows a cross-sectional view of a conventional lateral bipolar transistor device.

In the prior art, as shown in FIG. 1, the diameter of the sub-base collector region between field oxide regions 24 and 27 must be 1.8 microns in order to accommodate a 0.3 micron alignment tolerance without having emitter isolation wall 34 pinch off base region 26. This design tolerance of 1.8 microns for the base region is able to be reduced in the present invention by keeping the top of the field oxide regions 54 below the bottom surface of the emitter isolation wall 72 and slanting the walls of the base region 65. Accordingly, the base island width is reduced from 1.8 microns to 0.9 microns. The extrinsic base resistance can be further reduced by using polycide ($WSi_2$) rather than platinum silicide (PtSi). The base capacitance is approximately ½ of the base capacitance of the bipolar transistors of the prior art, which the inventor anticipates will produce approximately a 30–40% gain in speed performance.

The foregoing description of the invention has been presented for purposes of illustration and description. It is not intended to be exhaustive or to limit the invention to the precise embodiment disclosed, and other modifications and variations may be possible in light of the above teachings. For example, the base polysilicon region 75 does not have to be a circular type region. Instead, this region could be one sided, like the transistor of FIG. 1. Also, the transistor of the present invention could be p-n-p rather than the n-p-n transistor disclosed without departing from the general principles of the present invention. Further, the bipolar transistor could be fabricated from other materials, such as, by way of example only, Gallium Arsenide or Silicon Carbide. And finally, the field oxide region 54 can also be a swami region or any other known type of dielectric.

The embodiment was chosen and described in order to best explain the principles of the invention and its practical application to thereby enable others skilled in the art to best utilize the invention in various embodiments and modifications as are suited to the particular use contemplated. It is intended that the appended claims be construed to include other alternative embodiments of the invention except insofar as limited by the prior art.

What is claimed is:

1. A transistor comprising:

a substrate having a first surface and a second surface;

an epitaxial layer having a first surface and a second surface, said second surface of said epitaxial layer being adjacent said first surface of said substrate;

a collector in said first surface of said substrate, said collector having a contact region, said collector contact region extending from said collector to said first surface of said epitaxial layer;

a mesa region having a first surface and a second surface, said first surface of said mesa region being coplanar with said first surface of said epitaxial layer, said second surface being adjacent to a channel region of said collector;

a field oxide region surrounding said mesa region, said field oxide region having a first surface and a second surface opposing said first surface, said second surface of said field oxide region being on said collector region, said first surface of said field oxide region being along a side wall of said mesa region, such that said field oxide region neither reaches nor crosses the plane of said first surface of said mesa region;

a base region formed in said mesa region, said base region having a first surface and a second surface, wherein said first surface of said base is coplanar with said first surface of said mesa region and said second surface of said base extends into said mesa region;

an emitter region on said first surface of said base, said emitter being smaller in diameter than said first surface of said base;

emitter isolation walls surrounding said emitter and extending into said first surface of said base, whereby said emitter isolation walls neither reach nor cross the plane of said first surface of said field oxide region; and electrical contacts for said collector contact region, said base and said emitter, wherein said electrical contacts permit electrical access to said transistor.

2. The transistor according to claim 1 wherein said second surface of said base region does not cross the plane of said first surface of said field oxide region.

3. The transistor according to claim 2 wherein said emitter isolation walls do not cross the plane of said second surface of said base.

4. The transistor according to claim 3 wherein said first surface of said field oxide region and said first surface of said mesa region are separated by approximately 2000 angstroms.

5. The transistor according to claim 4 wherein said emitter isolation walls extend approximately 1000 angstroms into said mesa region.

6. The transistor according to claim 5 wherein said base region is approximately 0.9 microns in diameter.

7. The transistor according to claim 6 wherein said first surface of said mesa region is smaller in diameter than said second surface of said mesa region.

8. A lateral bipolar transistor device comprising:

a substrate of a first conductivity type having a first surface and a second surface;

an epitaxial layer having a first surface and a second surface, said second surface of said epitaxial layer being adjacent said first surface of mid substrate;

a mesa on said first surface of said substrate, said mesa having a lower surface and an upper surface, said lower surface of said mesa being adjacent said first surface of said epitaxial layer, said mesa having a collector region of a second conductivity type extending upward from said lower surface and a base region of a first conductivity type extending downward from said upper surface forming a junction between said base region of said first conductivity type and said collector region of said second conductivity type;

a dielectric surrounding said mesa, said dielectric extending from said collector region, past said junction between said base region and said collector region and stopping below said upper surface of said mesa, creating an island of said upper surface of said mesa, said island substantially comprising said base region;

an emitter region of a second conductivity type formed on said island, said emitter region being substantially smaller than said island, said emitter region being in contact with said base region;

an isolation wall surrounding said emitter and extending downwardly into said upper surface of said mesa without reaching or crossing the plane of said junction between said base region and said collector region;

an electrically conductive material formed on said emitter, base and collector regions and forming emitter, base and collector contacts, respectively.

9. The transistor according to claim 8 wherein said dielectric surrounding said mesa stops approximately 0.2 microns below said upper surface of said mesa.

10. The transistor according to claim 9 wherein said isolation wall surrounding said emitter extends approximately 0.1 microns into said mesa.

11. The transistor according to claim 10 wherein said dielectric surrounding said mesa and said isolation wall surrounding said emitter are separated by approximately 0.1 microns.

12. The transistor according to claim 11 wherein said junction between said base region and said collector region is approximately 0.9 microns in diameter.

13. The transistor according to claim 12 wherein said upper surface of said mesa is smaller in diameter than said lower surface of said mesa.

\* \* \* \* \*

UNITED STATES PATENT AND TRADEMARK OFFICE
CERTIFICATE OF CORRECTION

PATENT NO. : 5,465,006
DATED : Nov. 7, 1995
INVENTOR(S) : Yaw-Hwang Chen

It is certified that error appears in the above-indentified patent and that said Letters Patent is hereby corrected as shown below:

Col. 6, Claim 8, 1. 20: delete "mid" and insert therefor --said--

Signed and Sealed this

Eighteenth Day of March, 1997

Attest:

BRUCE LEHMAN

Attesting Officer

Commissioner of Patents and Trademarks